(12) United States Patent
Miura

(10) Patent No.: US 8,039,917 B2
(45) Date of Patent: *Oct. 18, 2011

(54) PHOTODIODE AND PHOTO IC USING SAME

(75) Inventor: Noriyuki Miura, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 668 days.

This patent is subject to a terminal disclaimer.

(21) Appl. No.: 12/037,115

(22) Filed: Feb. 26, 2008

(65) Prior Publication Data

US 2008/0296642 A1    Dec. 4, 2008

(30) Foreign Application Priority Data

Mar. 19, 2007   (JP) .................................. 2007-071344

(51) Int. Cl.
 *H01L 31/06* (2006.01)
(52) U.S. Cl. ........ 257/464; 257/290; 257/461; 257/463; 257/E31.076
(58) Field of Classification Search .................. 257/292, 257/293, 464, E27.13, 347, 290, 461, 462, 257/463, E31.076; 438/48
See application file for complete search history.

(56) References Cited

U.S. PATENT DOCUMENTS

| 6,545,333 | B1 * | 4/2003 | Ketchen et al. | ............... 257/461 |
| 7,419,844 | B2 * | 9/2008 | Lee et al. | ........................ 438/48 |
| 2006/0118918 | A1 * | 6/2006 | Waite et al. | .................... 257/627 |
| 2007/0114582 | A1 * | 5/2007 | Shiu et al. | ...................... 257/292 |
| 2007/0278574 | A1 * | 12/2007 | Hsu et al. | ....................... 257/347 |

FOREIGN PATENT DOCUMENTS

| JP | 07162024 | 6/1995 |
| JP | 2002314117 | 10/2002 |

OTHER PUBLICATIONS

A. Afzalian et al., "Physical Modeling and Design of Thin-Film SOI Lateral PIN Photodiodes", IEEE Transactions on Electron Device, vol. 52, No. 6, Jun. 2005, pp. 1116-1122.

* cited by examiner

*Primary Examiner* — Kenneth Parker
*Assistant Examiner* — Jose R Diaz
(74) *Attorney, Agent, or Firm* — Volentine & Whitt, PLLC

(57) ABSTRACT

A photodiode includes a first silicon semiconductor layer formed over an insulating layer, a second silicon semiconductor layer formed over the insulating layer, having a thickness ranging from greater than or equal to 3 nm to less than or equal to 36 nm, a low-concentration diffusion layer which is formed in the second silicon semiconductor layer and in which an impurity of either one of a P type and an N type is diffused in a low concentration, a P-type high-concentration diffusion layer which is formed in the first silicon semiconductor layer and in which the P-type impurity is diffused in a high concentration, and an N-type high-concentration diffusion layer which is opposite to the P-type high-concentration diffusion layer with the low-concentration diffusion layer interposed therebetween and in which the N-type impurity is diffused in a high concentration.

8 Claims, 8 Drawing Sheets

PHOTODIODE AND PHOTO IC USING SAME

BACKGROUND OF THE INVENTION

The present invention relates to a photodiode which produces current in response to light, particularly ultraviolet light, and a photo IS using the photodiode.

With an increase in the amount of irradiation of ultraviolet light or rays due to the destruction of the ozone layer, the influence of ultraviolet light contained in sunlight on the human body and the environment has been feared in these days.

The ultraviolet light means invisible light in an ultraviolet range of 400 nm or less in wavelength. Since, however, the sunlight contains visible light and infrared rays in addition to the ultraviolet light, it has been required that an ultraviolet-light detecting photodiode separates and detects only the ultraviolet light.

Therefore, an ultraviolet-light penetration filter for allowing only ultraviolet light to pass therethrough is generally provided on the upper surface of a photodiode to separate and detect only the ultraviolet light.

In this type of ultraviolet-light penetration filter, the amount of ultraviolet transmission is reduced due to its deterioration. Therefore, as a conventional photodiode, a horizontal photodiode wherein comb teeth portions of an N+ diffusion layer in which an N-type impurity is diffused in a high concentration and which is shaped in the form of an "E"-shaped comb, and a P+ diffusion layer in which a P-type impurity is diffused in a high concentration and which is shaped in the form of a "π"-shaped comb, are engaged with each other and these comb teeth portions are disposed opposite to each other, is formed in a silicon semiconductor layer with the N-type impurity diffused therein in a low concentration, of a semiconductor wafer of SOI (Silicon On Insulator) structure in which the silicon semiconductor layer is formed on a silicon substrate with an embedded oxide film interposed therebetween. The thickness of the silicon semiconductor layer of the photodiode is set to a thickness of about 150 nm to allow visible light to pass therethrough and absorb only the ultraviolet light [refer to, for example, a patent document 1 (Japanese Unexamined Patent Publication No. Hei 7 (1995)-162024 (paragraph 0020 in the 3rd page and paragraph 0025 in the 4th page—paragraph 0035 in the 5th page, and FIGS. 2 and 3))].

In the above related art, however, the photodiode is formed wherein the silicon semiconductor layer is formed on the embedded oxide film of the semiconductor wafer of SOI structure, and the thickness of the silicon semiconductor layer of the photodiode is set to the thickness of about 150 nm, thereby to allow the visible light to pass therethrough and absorb only the ultraviolet light. Therefore, according to findings shown below, a problem arises in that the influence of reflection at the boundary face between the silicon semiconductor layer and the embedded oxide film cannot be avoided and the total quantity of ultraviolet light in the ultraviolet range of 400 nm or less in wavelength cannot be detected accurately.

That is, the inventors have determined by calculation the thickness of the silicon semiconductor layer which allows visible light to pass therethrough and absorb only a wavelength range of ultraviolet light, that is, which is capable of selectively detecting ultraviolet light.

That is, optical absorptance I/Io in silicon is represented by the Beer law expressed in the following equation (1):

$$I/Io=\exp(-\alpha Z) \quad (1)$$

where α: light absorption coefficient, Z: entrance depth of light, I: light intensity at depth Z, and Io: intensity of incident light It is understood that when the optical absorptance I/Io is determined every thickness (Z) of the silicon semiconductor layer using the equation (1) in consideration of wavelength dependence of the light absorption coefficient α, and such a wavelength that the optical absorptance I/Io relative to the thickness of the silicon semiconductor layer 4 becomes 10%, is determined, the thickness of the silicon semiconductor layer may be set to a thickness of 50 nm or less to selectively have or hold sensitivity in the ultraviolet range of 400 nm or less in wavelength.

On the basis of the above result of calculations, a silicon semiconductor layer varied in various ways in a range of 50 nm or less in wavelength is formed in a semiconductor wafer of SOI structure, and horizontal photodiodes are formed in the silicon semiconductor layer. Sensitivity of these to the wavelength of light were measured by experiment.

FIG. 2 is a graph showing sensitivity of a photodiode at the time that the thickness of the silicon semiconductor layer is set to 40.04 nm.

It is understood that in the photodiode set to about 40 nm in thickness as shown in FIG. 2, a subpeak (marked in a circle shown in FIG. 2) exists in a wavelength range (purple) of visible light longer than the wavelength range of ultraviolet light of 400 nm or less in wavelength, and a photoelectric current that reacts to the wavelength range of visible light is contained in the detected photoelectric current.

It is considered that this is because in the case of an actual photodiode, although the above calculation is made assuming that light passes through the silicon semiconductor layer as it is, light is reflected by the boundary face between the silicon semiconductor layer and the embedded oxide film, and the length of a path through which the light passes becomes longer and hence it reacts with visible light having a wavelength longer than the wavelength range of ultraviolet light, so that it is absorbed into the silicon semiconductor layer and appears as a subpeak.

Such a subpeak further appears even at a thin silicon semiconductor layer. A result obtained by determining each wavelength (called "subpeak wavelength") that appears thereat by experiment is shown in FIG. 3.

As shown in FIG. 3, the subpeak wavelength becomes shorter as the thickness of the silicon semiconductor layer becomes thinner. Assuming that the thickness of the silicon semiconductor layer is Tsi (unit: nm), and the subpeak wavelength is Ls (unit: nm), the subpeak wavelength is made approximate by the following experimental equation. In order to avoid the influence of reflection at the boundary face between the silicon semiconductor layer and the embedded oxide film and prevent reaction with visible light having a wavelength longer than a wavelength of 400 nm, i.e., avoid an error due to the addition of the photoelectric current in the wavelength range of visible light to the total quantity of the detected ultraviolet light, the thickness of the silicon semiconductor layer needs to be set to a thickness of 36 nm or less.

$$Ls=2.457Tsi+312.5 \quad (2)$$

SUMMARY OF THE INVENTION

The present invention has been made based on the above findings. An object of the present invention is to provide a photodiode capable of accurately detecting the total quantity of ultraviolet light in avoidance of an influence of reflection at a boundary face between a silicon semiconductor layer and an insulating layer.

According to one aspect of the present invention, for attaining the above object, there is provided a photodiode comprising a first silicon semiconductor layer formed over an insulating layer, a second silicon semiconductor layer formed over the insulating layer, having a thickness ranging from greater than or equal to 3 nm to less than or equal to 36 nm, a low-concentration diffusion layer which is formed in the second silicon semiconductor layer and in which an impurity of either one of a P type and an N type is diffused in a low concentration, a P-type high-concentration diffusion layer which is formed in the first silicon semiconductor layer and in which the P-type impurity is diffused in a high concentration, and an N-type high-concentration diffusion layer which is opposite to the P-type high-concentration diffusion layer with the low-concentration diffusion layer interposed therebetween and in which the N-type impurity is diffused in a high concentration.

Thus, the present invention obtains advantageous effects in that received visible light can be cut by the thickness of a second silicon semiconductor layer for forming a low-concentration diffusion layer inclusive of reflection at a boundary face or interface between a silicon semiconductor layer and an insulating layer, and ultraviolet light is selectively detected from the received light and the total quantity of the ultraviolet light can hence be detected accurately.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a photodiode according to the present invention will hereinafter be described with reference to the accompanying drawings.

Preferred Embodiments

Figure 1:
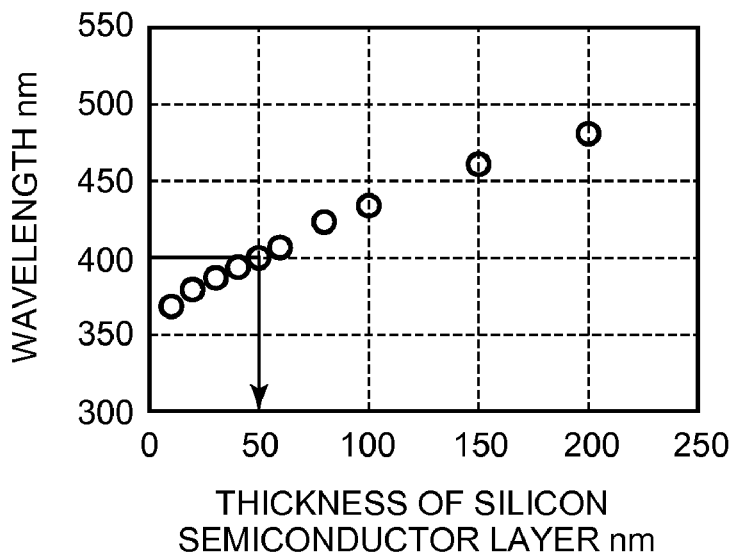
FIG. 1 is a graph showing a wavelength at which optical absorptance based on the thickness of a silicon semiconductor layer made of silicon (100) reaches 10%.
Figure 2:
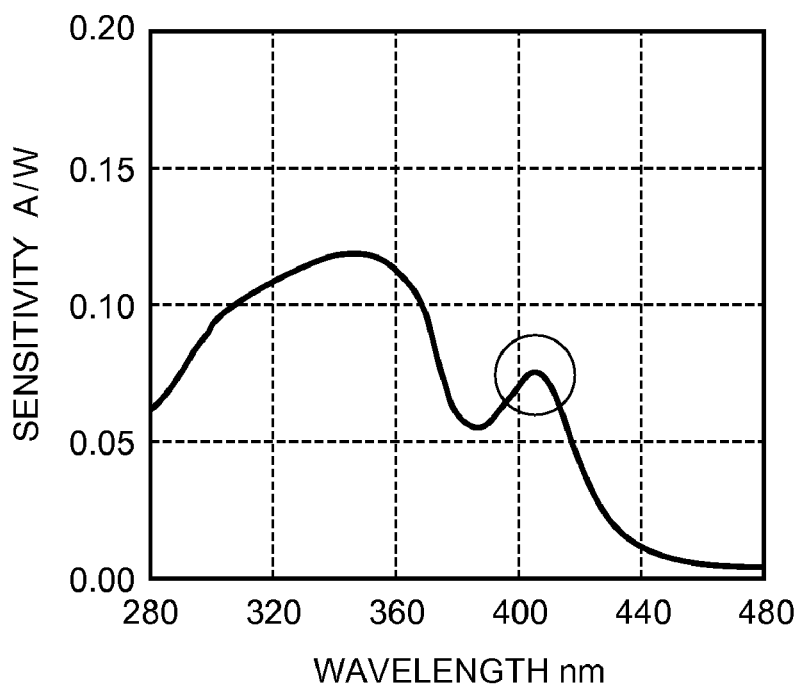
FIG. 2 is a graph illustrating sensitivity of a photodiode at the time that the thickness of the silicon semiconductor layer is set to 40.04 nm.
Figure 3:
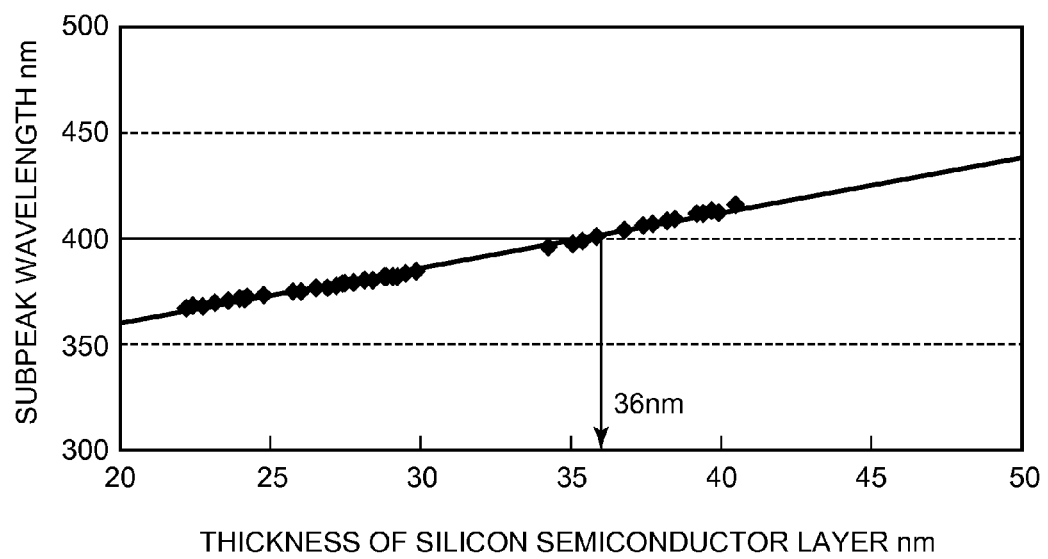
FIG. 3 is a graph depicting a subpeak wavelength based on the thickness of the silicon semiconductor layer.
Figure 4:
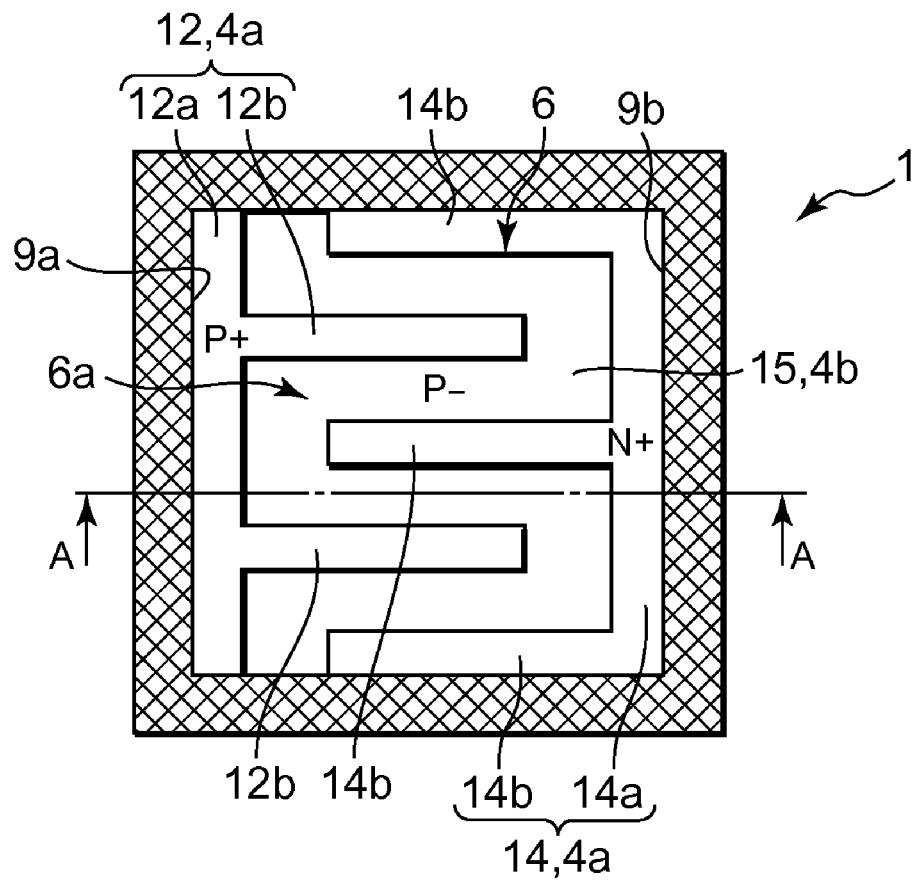
FIG. 4 is an explanatory view showing an upper surface of a photodiode according to an embodiment.
Figure 5:
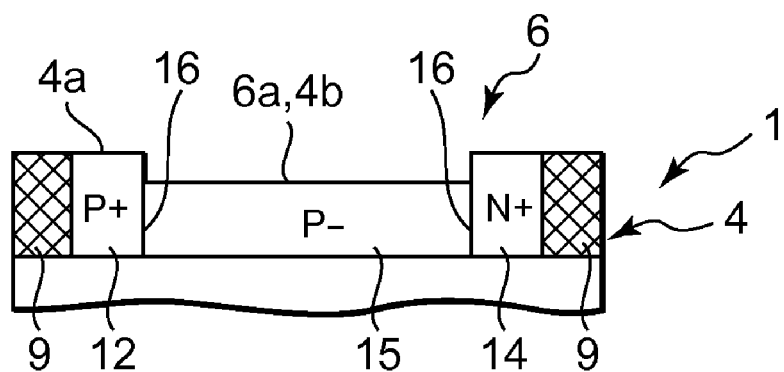
FIG. 5 is an explanatory view illustrating a section of the photodiode according to the embodiment.

FIG. 4 is an explanatory view showing an upper surface of a photodiode according to an embodiment, FIG. 5 is an explanatory view illustrating a section of the photodiode according to the embodiment, and FIGS. 6 through 9 are explanatory views showing a method for manufacturing a photo IC according to an embodiment.

Incidentally, FIG. 5 is a sectional view taken along sectional line A-A of FIG. 4.

In FIGS. 4 and 5, reference numeral 1 indicates a photodiode formed in a silicon semiconductor layer 4 of a semiconductor wafer of SOI structure, which is formed, on an unillustrated silicon substrate made of silicon (Si), with the silicon semiconductor layer 4 comprised of thin monocrystal silicon with an embedded oxide film 3 used as an insulating layer comprised of silicon oxide ($SiO_2$) being interposed therebetween.

As shown in FIGS. 6 through 9, a diode forming area 6 for forming the photodiode 1 and transistor forming areas 8a and 8b for forming an nMOS element 21 and a pMOS element 31 (both to be described later) each used as a MOSFET (Metal Oxide Semiconductor Field Effect Transistor) are set onto the silicon semiconductor layers 4.

A low-concentration diffusion layer forming area 6a for forming a P– diffusion layer 15 (to be described later) is set to the diode forming area 6.

Further, device isolation areas 10 for forming device isolation layers 9 are set to areas that surround the peripheries of the diode forming area 6 and the transistor forming areas 8a and 8b in rectangular frame form.

The silicon semiconductor layer 4 employed in the present embodiment comprises first and second silicon semiconductor layers 4a and 4b respectively set to different thicknesses. Only the silicon semiconductor layer 4 in the low-concentration diffusion layer forming area 6a is set to the thickness of the second silicon semiconductor layer 4b thinner than the first silicon semiconductor layer 4a in thickness. The thickness thereof is formed to a thickness of 36 nm or less (35 nm in the present embodiment) to selectively detect ultraviolet light in the ultraviolet range of 400 nm or less in wavelength according to the above findings.

In this case, it is desirable to set the lower limit of the thickness of the second silicon semiconductor layer 4b to 3 nm.

This is because when the thickness of the second silicon semiconductor layer 4b is set to less than 3 nm, it becomes difficult to accommodate variations in the thickness at the time that the second silicon semiconductor layer 4b is formed in the semiconductor wafer.

Each of the device isolation layers 9 is formed in the first silicon semiconductor layer 4a thick in thickness in the device isolation area 10 so as to reach the embedded oxide film 3 with an insulating material such as silicon oxide. The device isolation layers 9 respectively have the function of electrically insulating and isolating between the diode forming area 6 and the transistor forming areas 8a and 8b for the first silicon semiconductor layers 4a.

Incidentally, the device isolation layers 9 are shown with being hatched for distinctions as shown in FIGS. 4, 5 and the like in the present description.

The photodiode 1 according to the present embodiment is formed in the diode forming area 6 having the first and second silicon semiconductor layers 4a and 4b different in thickness.

Reference numeral 12 indicates a P+ diffusion layer used as a P-type high-concentration diffusion layer, which is a diffusion layer formed by diffusing a P-type impurity such as boron (B) into the first silicon semiconductor layer 4a in the diode forming area 6 in a relatively high concentration. As shown in FIG. 4, the P+ diffusion layer 12 is shaped in a comb type formed of a ridge portion 12a which contacts one side 9a lying inside the device isolation layer 9, and a plurality of comb teeth portions 12b that extend from the ridge portion 12a to the other side 9b opposite to the one side 9a, lying inside the device isolation layer 9.

The P+ diffusion layer 12 employed in the present embodiment is shaped in an "π"-shaped fashion in such a manner that the two comb teeth portions 12b are extended from the ridge portion 12a.

Reference numeral 14 indicates an N+ diffusion layer used as an N-type high-concentration diffusion layer, which is a diffusion layer formed by diffusing an N-type impurity of a type opposite to the P-type high-concentration diffusion layer, i.e., phosphorus (P) or Arsenic (As) into the first silicon semiconductor layer 4a in the diode forming area 6. As shown in FIG. 4, the N+ diffusion layer 14 is formed in a comb type formed of a ridge portion 14a that contacts the other side 9b lying inside the device isolation layer 9, and a plurality of comb teeth portions 14b which extend from the ridge portion 14a to the opposite one side 9a.

The N+ diffusion layer 14 employed in the present embodiment is formed in an "E"-shaped fashion in such a manner that the three comb teeth portions 14b are extended from both ends of the ridge portion 14a and its central portion.

Reference numeral 15 indicates a P− diffusion layer used as a low-concentration diffusion layer, which is a diffusion layer formed, with the P-type impurity being diffused therein in a relatively low concentration, in the second silicon semiconductor layer 4b in the low-concentration diffusion layer forming area 6a (area interposed between the "π"-shaped P+ diffusion layer 12 and the "E"-shaped N+ diffusion layer 14 in the diode forming area 6 shown in FIG. 4) adjacent to the P+ diffusion layer 12 and the N+ diffusion layer 14 respectively, which are disposed opposite to each other with being spaced from each other in a state in which the comb teeth portions 12b and 14b are engaged with each other. The P− diffusion layer 15 is a portion or region at which electron-hole pairs are generated by ultraviolet light absorbed in a depletion layer formed here.

Figure 9:
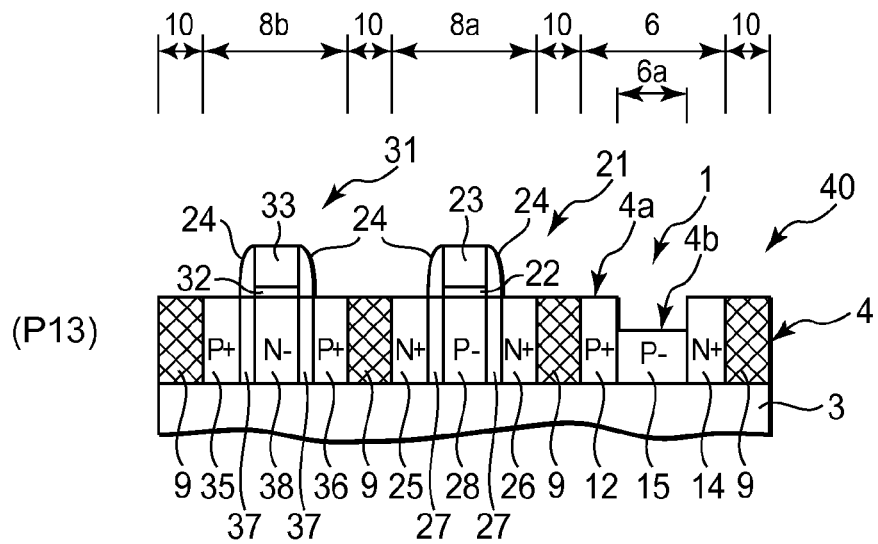
FIG. 9 is an explanatory view showing the method for manufacturing the photo IC according to the embodiment.

With the above configuration, the photodiode 1 according to the present embodiment is formed in such a manner that as shown in FIG. 4, the P+ diffusion layer 12 and the N+ diffusion layer 14 are disposed opposite to each other with the P− diffusion layer 15 interposed therebetween in a state of their comb teeth portions 12b and 14b being engaged with each other, and peripheral edge portions excluding boundaries 16 between both diffusion layers and the P− diffusion layer 15 are brought into contact with the device isolation layer 9, As shown in FIG. 9(P13), the photodiode 1 according to the present embodiment is formed together with the nMOS element 21 and the pMOS element 31 formed in the first silicon semiconductor layer 4a thick in thickness.

The nMOS element 21 employed in the present embodiment is formed in the transistor forming area 8a set to the first silicon semiconductor layer 4a.

In FIG. 9 (P13), reference numeral 22 indicates a gate oxide film, which is an insulating film relatively thin in thickness comprised of an insulating material such as silicon oxide.

Reference numeral 23 indicates a gate electrode, which is an electrode comprised of polysilicon or the like formed by diffusing an impurity (N type in the present embodiment) of the same type as a source layer 25 (to be described later) in a relatively high concentration. The gate electrode 23 is formed opposite to the first silicon semiconductor layers 4a, in the central portion of the transistor forming area 8a as viewed in a gate length direction with the gate oxide film 22 interposed therebetween. Sidewalls 24 each made up of an insulating material such as silicon nitride ($Si_3N_4$) are formed on their corresponding side surfaces.

The source layer 25 and a drain layer 26 in which an N-type impurity is diffused in a relatively high concentration, are formed in the first silicon semiconductor layers 4a provided on both sides of the gate electrode 23 in the transistor forming area 8a. Extensions 27 for the source layer 25 and the drain layer 26 are formed on their corresponding gate electrode 23 sides by diffusing the same type of impurity as the source layer 25 in a concentration (called "middle concentration") lower than at the source layer 25.

A channel region 28 formed with a channel for the nMOS element 21, in which a P-type impurity corresponding to an impurity of a type opposite to the source layer 25 is diffused in a relatively low concentration, is formed in the first silicon semiconductor layer 4a lying between the extensions 27 for the source layer 25 and the drain layer 26 located below the gate oxide film 22.

The pMOS element 31 employed in the present embodiment is similarly formed in the transistor forming area 8b set to the first silicon semiconductor layer 4a in a state in which the type of impurity is made opposite to the nMOS element 21. The pMOS element 31 has a source layer 35 and a drain layer 36, and a gate electrode 33 formed with sidewalls 24 on side surfaces opposite to a channel region 38 located between extensions 37 for the source layer 35 and the drain layer 36 with a gate oxide film 32 interposed therebetween.

The P+ diffusion layer 12 of the photodiode 1 according to the present embodiment and the source layer 35 and drain layer 36 of the pMOS element 31 are respectively formed by diffusing the same impurity as the P type in the same concentration. The N+ diffusion layer 14 of the photodiode 1 and the source layer 25 and drain layer 26 of the nMOS element 21 are respectively formed by diffusing the same impurity as the N type in the same concentration.

Further, the P− diffusion layer 15 of the photodiode 1 and the channel region 28 of the NMOS element 21 are respectively formed by diffusing the same impurity as the P type in the same concentration.

Incidentally, the gate length direction means the direction that extends from the source layer 25 or 35 to the drain layer 26 or 36 in parallel with the upper surface of the first silicon semiconductor layer 4a, or its opposite direction.

Figure 6:
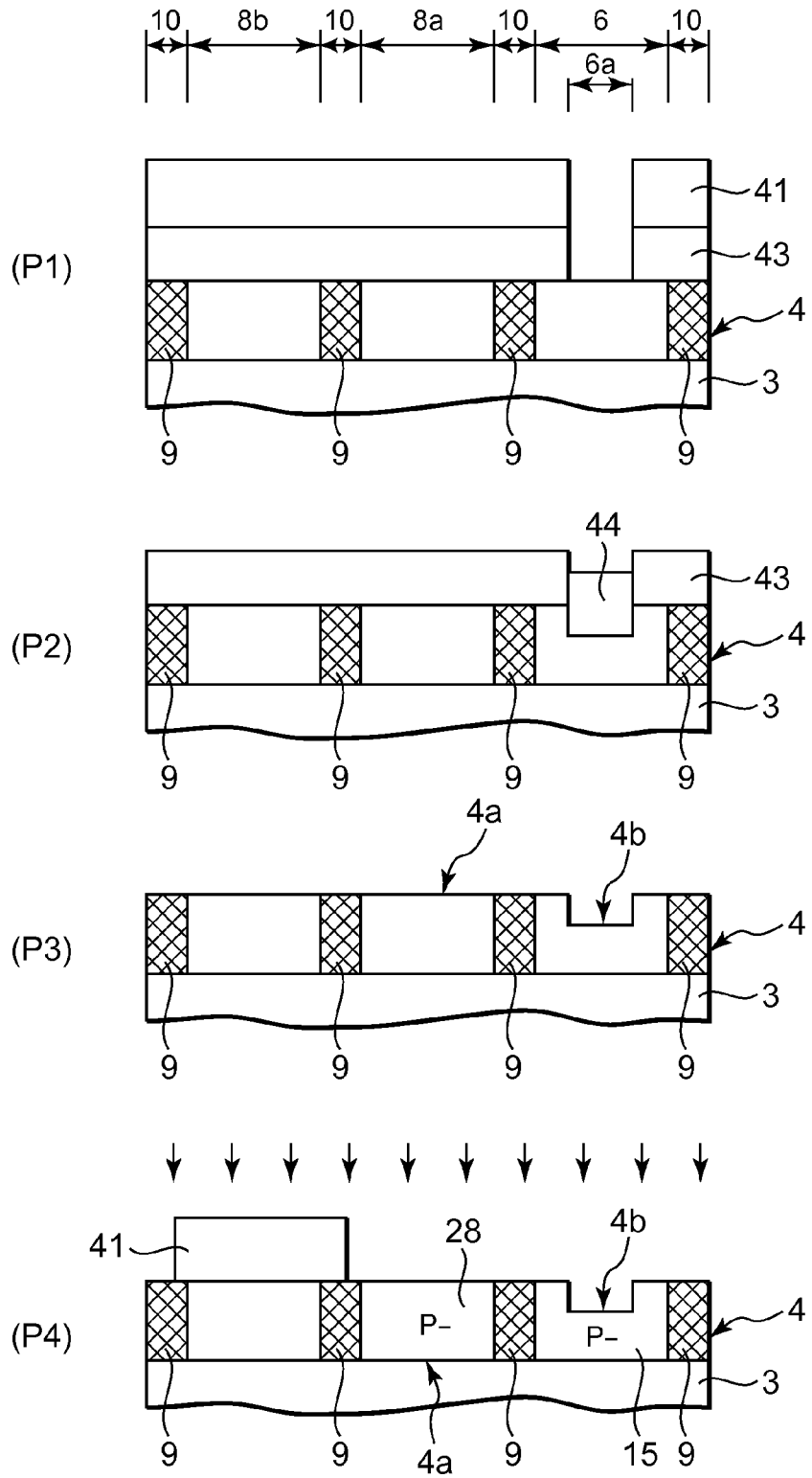
FIG. 6 is an explanatory view depicting a method for manufacturing a photo IC according to an embodiment.
Figure 7:
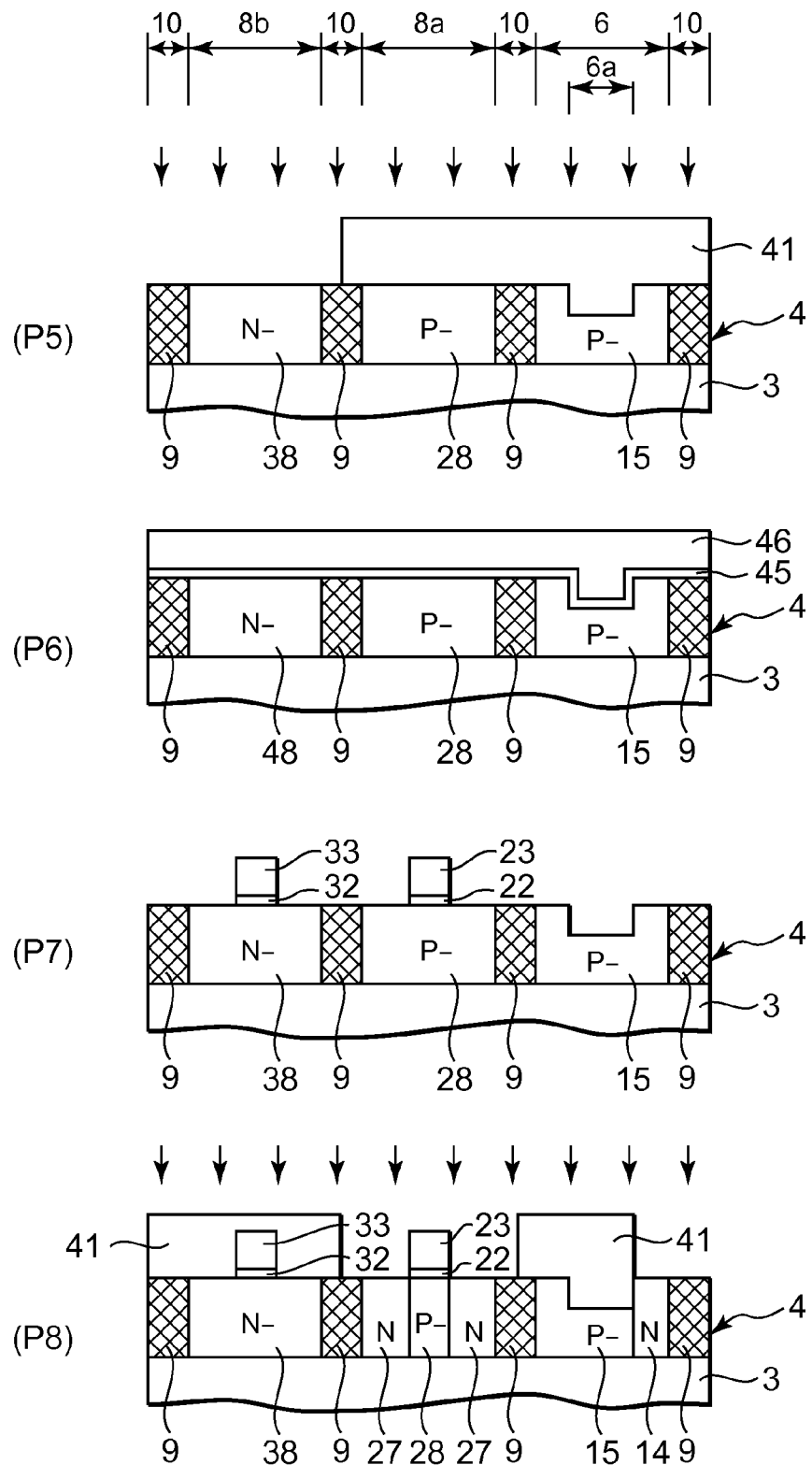
FIG. 7 is an explanatory view showing the method for manufacturing the photo IC according to the embodiment.
Figure 8:
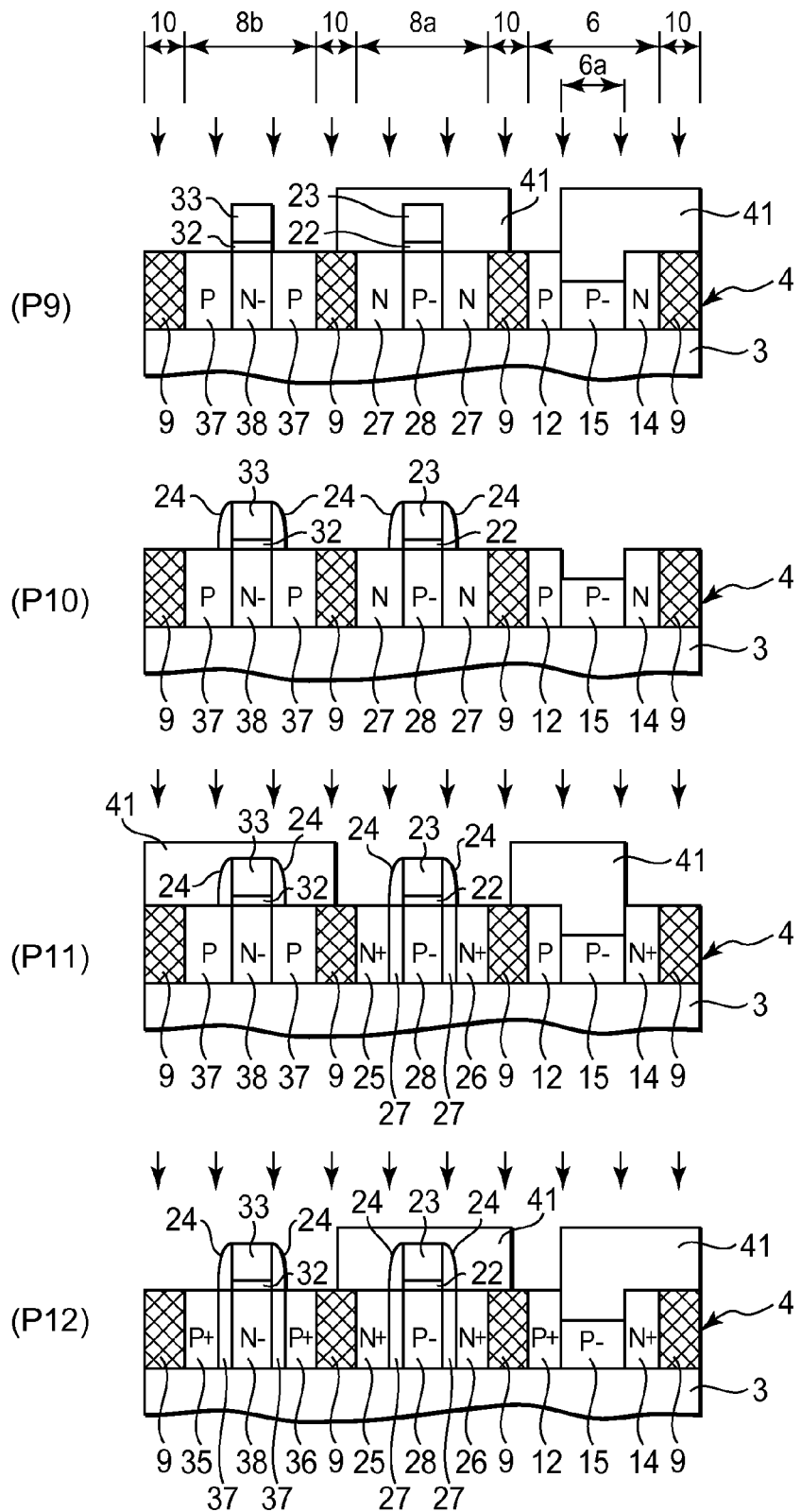
FIG. 8 is an explanatory view illustrating the method for manufacturing the photo IC according to the embodiment.

In FIGS. 6 through 8, reference numeral 41 indicates a resist mask used as a mask member, which is a mask pattern formed by subjecting a positive or negative resist applied onto the corresponding silicon semiconductor layer 4 to exposure and development processing by photolithography. The resist mask 41 functions as a mask for etching and ion implantation in the present embodiment.

The thickness of the first silicon semiconductor layer 4a is formed to a thickness of 30 nm or more.

Figure 10:
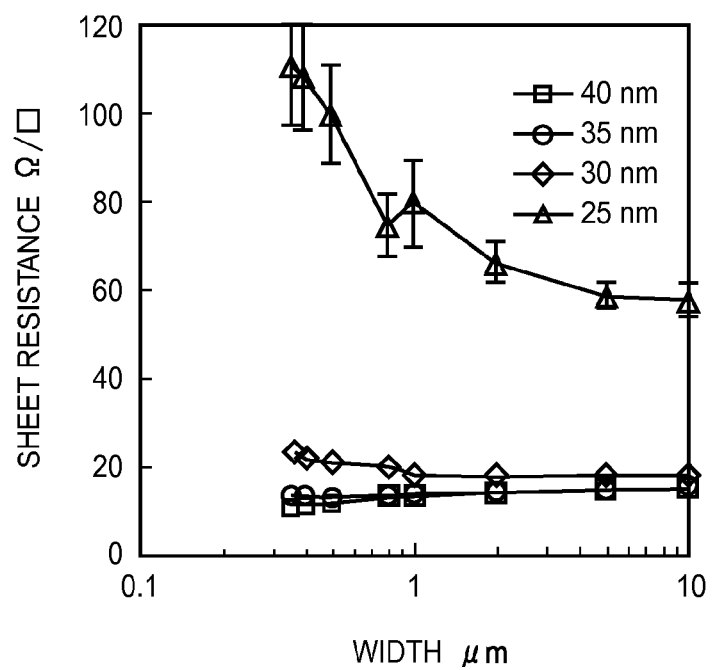
FIG. 10 is a graph illustrating the sheet resistance of a P+ diffusion layer employed in the embodiment.
Figure 11:
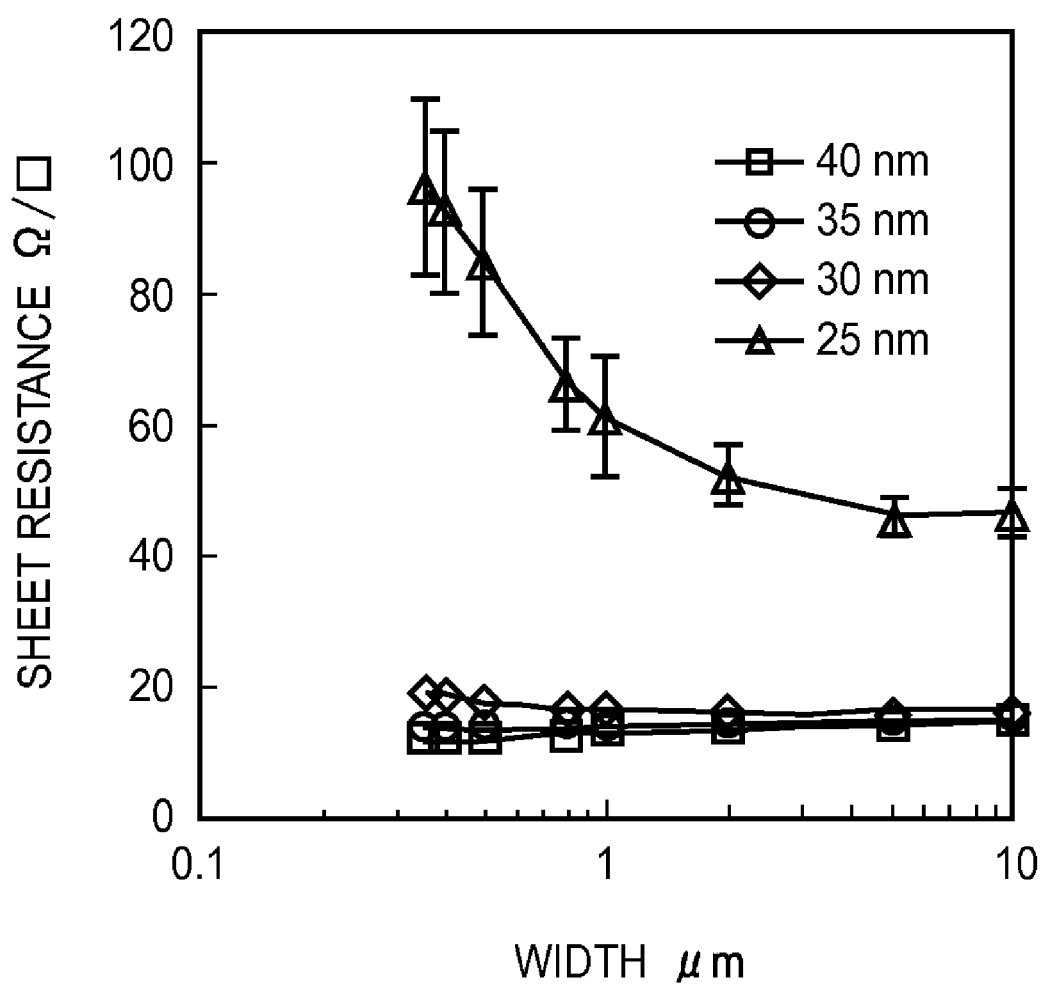
FIG. 11 is a graph showing the sheet resistance of an N+ diffusion layer employed in the embodiment.

This is because as indicated by experimental results of sheet resistance of the P+ diffusion layer 12 shown in FIG. 10 and experimental results of sheet resistance of the N+ diffusion layer 14 shown in FIG. 11, when the thicknesses of the P+ diffusion layer 12 and the N+ diffusion layer 14 of the photodiode 1 formed in the first silicon semiconductor layer 4a in the diode forming area 6 are respectively set to greater than or equal to 30 nm, the sheet resistance is stable in a range of about 20 Ω/sq or less, whereas when the thicknesses thereof are set to less than 30 nm, the sheet resistance rises extremely and the output produced from the photodiode 1 is lowered. Incidentally, the horizontal axes shown in FIGS. 10 and 11 respectively indicate the widths of the P+ diffusion layer 12 and the N+ diffusion layer 14 as viewed in the gate length direction, i.e., their widths as viewed in the sectional direction shown in FIG. 5.

In this case, it is desirable to set the thickness of the first silicon semiconductor layer 4a to a thickness greater than or equal to 30 nm and such a thickness that the nMOS element 21 and pMOS element 31 formed in the same first silicon semiconductor layer 4a can be operated efficiently.

This is because if the thickness of the first silicon semiconductor layer 4a for forming the P+ diffusion layer 12 and the N+ diffusion layer 14 is set to the same thickness as that of the silicon semiconductor layer 4 for forming the NMOS element 21 and the pMOS element 31, then the depth of each contact hole reaching the P+ diffusion layer 12 and the N+ diffusion layer 14 can be made identical to that of each contact hole that reaches the diffusion layers such as the source layers for the nMOS element 21 and the pMOS element 31, whereby the process of forming each contact plug can be brought into simplification thereby to make it possible to simplify the manufacturing process of the photo IC 40.

In this case, it is desirable to set the thickness of the silicon semiconductor layer 4 for forming the MOSFETs (nMOS element 21 and pMOS element 31), i.e., the thickness of the first silicon semiconductor layer 4a to greater than or equal to 40 nm. It is also desirable to set its upper limit to about 100 nm.

This is because when the thickness of the silicon semiconductor layer 4 for forming the MOSFETs is set to less than 40 nm, the influence of a variation (±10 nm or so) in thickness at the growth or deposition of the thickness of the silicon semiconductor layer 4 for forming the MOSFETs becomes large excessively, thus increasing a variation in the threshold voltage of each MOSFET, whereby the quality of each MOSFET cannot be made stable and the yield of the photo IC 40 is hence degraded.

The thickness of the silicon semiconductor layer 4a employed in the present embodiment is set to 50 nm.

A method for manufacturing the photo IC according to the present embodiment will be explained below in accordance with processes indicated by P in FIGS. 6 through 9.

A silicon semiconductor layer 4 of a semiconductor wafer according to the present embodiment is formed to 50 nm identical to the thickness of a first silicon semiconductor layer 4a by forming, using a thermal oxidation method, a sacrifice oxide film in a thin silicon layer of a semiconductor wafer of SOI structure formed with a thin silicon layer left on an embedded oxide film 3 by a SIMOX (Separation by Implanted Oxygen) method or a semiconductor wafer of SOI structure formed with a thin silicon layer attached onto an embedded oxide film 3 and removing it by wet etching.

A pad oxide film thin in thickness is formed on the silicon semiconductor layer 4 of the semiconductor wafer formed with the silicon semiconductor layer 4 of the predetermined thickness on the embedded oxide film 3 by the thermal oxidation method. A silicon nitride film comprised of silicon nitride is formed on the pad oxide film by a CVD (Chemical Vapor Deposition) method. A resist mask 41 (not shown) which covers a diode forming area 6 and transistor forming areas 8a and 8b, i.e., exposes each device isolation area 10, is formed on the silicon nitride film by photolithography. With it as a mask, the silicon nitride film is removed by anisotropic etching to expose the pad oxide film.

The resist mask 41 is removed and the silicon semiconductor layer 4 in each device isolation area 10 is oxidized by a LOCOS (Local Oxidation Of Silicon) method with the exposed silicon nitride as a mask to form each device isolation layer 9 that reaches the embedded oxide film 3. The silicon nitride film and the pad oxide film are removed by wet etching to form the device isolation layers 9 in the respective device isolation areas 10 of the silicon semiconductor layer 4.

At P1 (FIG. 6), a silicon nitride film 43 comprised of silicon nitride is formed by the CVD method on the silicon semiconductor layer 4 formed with the device isolation layers 9 in the above-described manner. A resist mask 41 that exposes a low-concentration diffusion layer forming area 6a in the diode forming area 6 is formed on the silicon nitride film 43 by photolithography. With it as a mask, the silicon nitride film 43 is removed by anisotropic etching to expose the silicon semiconductor layer 4 in the low-concentration diffusion layer forming area 6a.

At P2 (FIG. 6), the resist mask 41 formed at the process P1 is removed and a sacrifice oxide film 44 is formed in the silicon semiconductor layer 4 in the low-concentration diffusion layer forming area 6a by the thermal oxidation method.

At P3 (FIG. 6), the sacrifice oxide film 44 is removed by wet etching and the silicon nitride film 43 is removed by being immersed in thermal phosphoric acid, thereby forming a second silicon semiconductor layer 4b in which the thickness of the silicon semiconductor layer 4 in the low-concentration diffusion layer forming area 6a is set to a thickness of 35 nm.

Thus, the silicon semiconductor layer 4 in areas other than the low-concentration diffusion layer forming area 6a covered with the silicon nitride film 43 is formed as a first silicon semiconductor layer 4a.

At P4 (FIG. 6), a resist mask 41 that exposes the diode forming area 6 containing the first silicon semiconductor layer 4a and the second silicon semiconductor layer 4b in the corresponding transistor forming area 8a is formed by photolithography. With it as a mask, P-type impurity ions are implanted in the exposed first and second silicon semiconductor layers 4a and 4b to form a channel region 28 of an nMOS element 21 in which a P-type impurity is diffused into the first silicon semiconductor layer 4a in the transistor forming area 8a in a relatively low concentration and form a P– diffusion layer 15 of a photodiode 1 in which the P-type impurity is diffused into the second silicon semiconductor layer 4b in the diode forming area 6 in a relatively low concentration.

At this time, the P-type impurity is diffused even into the first silicon semiconductor layer 4a in the diode forming area 6 in a relatively low concentration.

At P5 (FIG. 7), the resist mask 41 formed at the process P4 is removed and a resist mask 41 that exposes the first silicon semiconductor layer 4a in the corresponding transistor forming area 8b is formed again by photolithography. With it as a mask, N-type impurity ions are implanted in the exposed first silicon semiconductor layer 4a to form a channel region 38 of a pMOS element 31 in which an N-type impurity is diffused into the first silicon semiconductor layer 4a in the transistor forming area 8b in a relatively low concentration.

At P6 (FIG. 7), the upper surfaces of the first and second silicon semiconductor layers 4a and 4b are oxidized by the thermal oxidation method to form a silicon oxide film 45. Polysilicon is deposited on the silicon oxide film 45 by the CVD method to form a relatively thick polysilicon layer 46.

At P7 (FIG. 7), a resist mask (not shown) that covers areas for forming gate electrodes 23 and 33 respectively located at central portions of the transistor forming areas 8a and 8b as viewed in their gate length directions is formed on the polysilicon layer 46 by photolithography. With it as a mask, the polysilicon layer 46 and the silicon oxide film 45 are etched by anisotropic etching to form the corresponding gate electrodes 23 and 33 opposite to the channel regions 28 and 38 formed in the first silicon semiconductor layers 4a of the transistor forming areas 8a and 8b through their corresponding gate oxide films 22 and 32, after which the resist mask is removed.

At P8 (FIG. 7), a resist mask 41 that exposes an area ("E"-shaped portion shown in FIG. 4) for forming an N+ diffusion layer 14 in the diode forming area 6, and the transistor forming area 8a is formed by photolithography. With it as a mask, N-type impurity ions are implanted in polysilicon of the exposed first silicon semiconductor layer 4a and gate electrode 23 to form extensions 27 of the nMOS 21 in which an N-type impurity is diffused into the first silicon semiconductor layers 4a located on both sides of the gate electrode 23 in a middle concentration. Along with it, the middle-concentration N-type impurity is diffused into the gate electrode 23 and the first silicon semiconductor layer 4a in the area for forming the N+ diffusion layer 14 in the diode forming area 6.

At P9 (FIG. 8), the resist mask 41 formed at the process P8 is removed and a resist mask 41 that exposes an area ("π"-shaped portion shown in FIG. 4) for forming a P+ diffusion layer 12 in the diode forming area 6, and the transistor forming area 8b is formed by photolithography. With it as a mask, P-type impurity ions are implanted in polysilicon of the exposed first silicon semiconductor layer 4a and gate electrode 33 to form extensions 37 of the pMOS 31 in which an P-type impurity is diffused into the first silicon semiconductor layers 4a located on both sides of the gate electrode 33 in a middle concentration. Along with it, the middle-concentration P-type impurity is diffused into the gate electrode 33 and the first silicon semiconductor layer 4a in the area for forming the P+ diffusion layer 12 in the diode forming area 6.

At P10 (FIG. 8), the resist mask 41 formed at the process P9 is removed and silicon nitride is deposited over the entire surfaces of the gate electrodes 23 and 33 and first and second silicon semiconductor layers 4a and 4b by the CVD method to form a silicon nitride film. The silicon nitride film is etched by anisotropic etching for selectively etching the silicon nitride film to expose the upper surfaces of the gate electrodes 23 and 33 and the upper surfaces of the first and second silicon semiconductor layers 4a and 4b, thereby forming sidewalls 24 on their corresponding side surfaces of the gate electrodes 23 and 33.

At P11 (FIG. 8), a resist mask 41 similar to that at the process P8 is formed by photolithography. With it as a mask, N-type impurity ions are implanted in polysilicon of the exposed first silicon semiconductor layer 4a and gate electrode 23 to from a source layer 25 and a drain layer 26 of the nMOS element 21 in which an N-type impurity is diffused into the first silicon semiconductor layers 4a located on both sides of the sidewalls 24 in a relatively high concentration, and an N+ diffusion layer 14 of the photodiode 1 in the first silicon semiconductor layer 4a of the diode forming area 6. Along with it, a relatively high-concentration N-type impurity is diffused into the gate electrode 23.

At P12 (FIG. 8), the resist mask 41 formed at the process P11 is removed and a resist mask 41 similar to that at the process P9 is formed by photolithography. With it as a mask, P-type impurity ions are implanted in polysilicon of the exposed first silicon semiconductor layer 4a and gate electrode 33 to form a source layer 35 and a drain layer 36 of the nMOS element 31 in which a P-type impurity is diffused into the first silicon semiconductor layers 4a located on both sides of the sidewalls 24 in a relatively high concentration, and a P+ diffusion layer 12 of the photodiode 1 in the first silicon semiconductor layer 4a of the diode forming area 6. Along with it, a relatively high-concentration P-type impurity is diffused into the gate electrode 33.

At P13 (FIG. 9), the resist mask 41 formed at the process P12 is removed and heat treatment for activating the respective diffusion layers is done to form the photodiode 1 according to the present embodiment, and the nMOS element 21 and the pMOS element 31.

Thereafter, an insulating material such as silicon oxide is deposited relatively thick over the entire upper surface of the silicon semiconductor layer 4 such as over the device isolation layers 9 and the like by the CVD method. Its upper surface is subjected to a flattening or planarization process to form an interlayer insulating film. A resist mask (not shown) having openings that expose the interlayer insulating film in contact hole forming areas on the P+ diffusion layer 12 and N+ diffusion layer 14, the source layers 25 and 35 and the drain layers 26 and 36 is formed on the interlayer insulating film by photolithography. With it as a mask, contact holes that extend through the interlayer insulating film and reach the P+ diffusion layer 12 and N+ diffusion layer 14, the source layers 25 and 35 and the drain layers 26 and 36 are formed by anisotropic etching for selectively etching the silicon oxide. After the removal of the resist mask, a conductive material is embedded into the contact holes by the CVD method or sputtering method to form contact plugs. Their upper surfaces are subjected to a planarization process to expose the upper surface of the interlayer insulating film.

Next, a conductive material is embedded into contact holes that reach the gate electrodes 23 and 33 in a manner similar to the above to form contact plugs. A planarization process is effected thereon to form the corresponding photo IC 40 according to the present embodiment.

Since the P− diffusion layer 15 of the photodiode 1 formed in this way is formed in the second silicon semiconductor layer 4b whose thickness is set so as to range from greater than or equal to 3 nm to less than or equal to 36 nm (35 nm in the present embodiment), a subpeak of visible light does not appear even though the visible light received by the photodiode 1 is reflected by the boundary face or interface between the first silicon semiconductor layer 4b and the embedded oxide film 3. It is possible to cut the visible light by the thickness of the first silicon semiconductor layer 4b and accurately detect the total quantity of ultraviolet light in an ultraviolet range of 400 nm or less in wavelength.

Since the P+ diffusion layer 12 and N+ diffusion layer 14 of the photodiode 1 according to the present embodiment are formed in the first silicon semiconductor layer 4a having a thickness (50 nm in the present embodiment) of 30 nm or more, the sheet resistance becomes no excessive and the output produced from the photodiode 1 is no longer reduced.

Further, since the thickness of the first silicon semiconductor layer 4a for forming the P+ diffusion layer 12 and the N+ diffusion layer 14 is formed to the same thickness as that of the silicon semiconductor layer 4 for forming the nMOS element 21 and the pMOS element 31, the depth of each contact hole that reaches each of the P+ diffusion layer 12 and the N+ diffusion layer 14 can be set to the same as that of the contact hole that reaches each of the diffusion layers such as the source layers of the nMOS element 21 and the pMOS element 31. Thus, the process of forming each contact plug is brought into simplification as compared with the case in which the thickness of the silicon semiconductor layer 4 for forming the nMOS element 21 is set to other thickness, thereby making it possible to further simplify the manufacturing process of the photo IC 40.

In this case, if the thickness of the silicon semiconductor layer 4 for forming each of the nMOS element 21 and the pMOS element 31 is set to greater than or equal to 40 nm, then the influence of a variation in thickness at the growth or deposition of the thickness of the silicon semiconductor layer 4 for forming each MOSFET can be suppressed and a variation in the threshold voltage of each MOSFET can be reduced, whereby the quality of each MOSFET can be made stable and the yield of the photo IC 40 can be enhanced.

Further, in the photodiode 1 according to the present embodiment, the P− diffusion layer 15 thereof diffuses the same P-type impurity as that for the channel region 28 of the NMOS element 21 constituting the photo IC 40 in the same concentration. Therefore, at the process P4 for forming the channel region 28 of the nMOS element 21, it can be formed simultaneously using the same resist mask 41, thereby making it possible to simplify the manufacturing process of the photo IC 40.

Furthermore, since the N+ diffusion layer 14 of the photodiode 1 diffuses the same N-type impurity as that for each of the source layer 25 and drain layer 26 of the NMOS element 21 constituting the photo IC 40 in the same concentration, they can be formed simultaneously using the same resist mask 41 at the process P11 for forming the source layer 25 and the drain layer 26 of the nMOS element 21, thereby making it possible to simplify the manufacturing process of the photo IC 40.

Still further, since the P+ diffusion layer 12 of the photodiode 1 diffuses the same P-type impurity as that for each of the source layer 35 and drain layer 36 of the pMOS element 31 constituting the photo IC 40 in the same concentration, they can be formed simultaneously using the same resist mask 41 at the process P12 for forming the source layer 35 and the drain layer 36 of the nMOS element 31, thereby making it possible to simplify the manufacturing process of the photo IC 40.

In the present embodiment as described above, a P− diffusion layer of a photodiode, in which a P-type impurity is diffused in a low concentration, is formed in a second silicon semiconductor layer having a thickness from greater than or equal to 3 nm to less than or equal to 36 nm, which is formed on an insulating layer. A P+ diffusion layer in which a P-type impurity is diffused in a high concentration, and an N+ diffusion layer which is disposed opposite to the P+ diffusion layer with a P− concentration diffusion layer interposed therebetween and in which an N-type impurity is diffused in a high concentration, are formed in a first silicon semiconductor layer formed on the insulating layer. Consequentially, received visible light can be cut depending on the thickness of the second silicon semiconductor layer for forming the P− diffusion layer inclusive of its reflection from a boundary face or interface between a silicon semiconductor layer and the insulating layer. It is thus possible to selectively detect ultraviolet light from the received light and accurately detect its total quantity.

Setting the thicknesses of the P+ diffusion layer and the N+ diffusion layer to the thickness of 30 nm or more makes it possible to prevent the sheet resistance of the high-concentration diffusion layer of the photodiode from becoming excessive and prevent the output produced from the photodiode from being reduced.

Further, since the thickness of the first silicon semiconductor layer for forming the P+ diffusion layer and the N+ diffusion layer is formed to greater than or equal to 30 nm and the same thickness as that of the silicon semiconductor layer for forming each MOSFET, the upper surfaces of the P+ diffusion layer and the N+ diffusion layer can be set to the same height as the upper surfaces of the source and drain layers of each MOSFET. Thus, the process at the formation of each contact plug is brought into simplification, thereby making it possible to simplify the manufacturing process of the photo IC.

Furthermore, the thickness of the silicon semiconductor layer for forming each MOSFET is set to the thickness of 40 nm or more. Therefore, the influence of a variation in thickness at the growth or deposition of the thickness of the silicon semiconductor layer 4 for forming each MOSFET can be suppressed, and a variation in the threshold voltage of each MOSFET can be reduced, thus making it possible to enhance the yield of the photo IC 40.

Incidentally, although the above embodiment has described that the thickness of the first silicon semiconductor layer is set to the thickness thicker than that of the second silicon semiconductor layer, the first and second silicon semiconductor layers may be set to the same thickness in a range from greater than or equal to 30 nm to less than or equal to 36 nm. Alternatively, the thickness of the first silicon semiconductor layer may be formed to a thickness thinner than that of the second silicon semiconductor layer in a range from greater than or equal to 30 nm to less than or equal to 36 nm. Even though done in this way, advantageous effects similar to the above can be obtained.

When the second silicon semiconductor layer is protruded from the first silicon semiconductor layer, the second silicon semiconductor layer low or thin in concentration may be protruded using its selection ratio and the difference in concentration between the impurities for the first and second silicon semiconductor layers upon selective anisotropic etching at the process P10.

Although the above embodiment has described that the low-concentration diffusion layer is formed by diffusing the P-type impurity, advantageous effects to the above can be obtained even though the N-type impurity is formed with being diffused in a relatively low concentration.

Further, although the above embodiment has described that the P+ diffusion layer is formed in a "π"-shaped fashion, and the N+ diffusion layer is shaped in an "E"-shaped fashion, their shapes may be reversed. The number of comb teeth portions may further be increased.

Furthermore, although the plurality of comb teeth portions are provided in the P+ diffusion layer and the N+ diffusion layer and disposed with being engaged with one another, only the ridge portions may be disposed opposite to each other with the low-concentration diffusion layer interposed therebetween without providing the comb teeth portions.

Still further, although the above embodiment has described that the semiconductor wafer is used as the semiconductor wafer of the SOI structure having the silicon semiconductor layer formed on the silicon substrate with the embedded oxide film used as the insulating layer being interposed therebetween, the semiconductor wafer of SOI structure is not limited to the above. A semiconductor wafer of SOI structure, such as an SOS (Silicon On Sapphire) substrate in which a silicon semiconductor layer is formed on a sapphire substrate used as an insulating layer, an SOQ (Silicon On Quartz) substrate in which a silicon semiconductor layer is formed on a quartz substrate used as an insulating layer, or the like may be adopted.

While the preferred forms of the present invention have been described, it is to be understood that modifications will be apparent to those skilled in the art without departing from the spirit of the invention. The scope of the invention is to be determined solely by the following claims.

What is claimed is:

1. A photodiode comprising:
    an insulating layer; and
    a silicon semiconductor layer over the insulating layer, the silicon semiconductor layer including
        a first section of a first conductivity type and having a first impurity concentration,
        a second section of a second conductivity type opposite the first conductivity type and having a second impurity concentration, the first and second sections spaced laterally away from each other, and
        a third section of the first conductivity type and having a third impurity concentration, the third impurity concentration lower than the first and second impurity concentrations,
        the third section interposed between the first and second sections, and having a thickness ranging from greater than or equal to 3 nm to less than or equal to 36 nm, and that is less than a thickness of the first and second sections.

2. The photodiode of claim 1, wherein the first and second conductivity types are respectively P-type and N-type.

3. The photodiode of claim 1, wherein the first and second conductivity types are respectively N-type and P-type.

4. The photodiode of claim 1, wherein the thickness of the third section is 35 nm, and the thickness of the first and second sections is 50 nm.

5. The photodiode of claim 1, further comprising an isolation layer that extends through the silicon semiconductor layer to be on the insulating layer, the isolation layer laterally surrounding the first, second and third sections.

6. The photodiode of claim 1, wherein the first section is π-shaped having first sections extending in a first direction from a first base section, and the second section is E-shaped having second sections extending in a second direction from a second base section,
    wherein the first and second directions are opposite directions, and respective pairs of the first and second sections are disposed adjacent to each other in a direction orthogonal to the first and second directions.

7. A photo integrated circuit comprising:
    the photodiode of claim 1; and
    a plurality of MOS transistors in a first silicon semiconductor layer, a thickness of the first silicon semiconductor layer is substantially the same as the thickness of the first and second sections.

8. The photo integrated circuit of claim 7, wherein the thickness of the first silicon semiconductor layer is greater than or equal to 40 nm.

* * * * *